United States Patent [19]

Bouldin et al.

[11] 4,298,684
[45] Nov. 3, 1981

[54] REFLECTIVE DATA STORAGE MEDIUM MADE BY SILVER DIFFUSION TRANSFER IN SILVER-HALIDE EMULSION INCORPORATING NUCLEI

[75] Inventors: Eric W. Bouldin, Woodside; Jerome Drexler, Los Altos Hills, both of Calif.

[73] Assignee: Drexler Technology Corporation, Mountain View, Calif.

[21] Appl. No.: 161,342

[22] Filed: Jun. 20, 1980

Related U.S. Application Data

[62] Division of Ser. No. 55,270, Jul. 6, 1979.

[51] Int. Cl.$^3$ .......................... G03C 5/54; G02B 27/22
[52] U.S. Cl. .................................... 430/616; 430/246; 430/251; 430/945; 430/964
[58] Field of Search ............... 430/246, 251, 616, 346, 430/416, 414, 495, 16, 229, 231, 945, 964; 346/1.1, 76 L, 135.1

[56] References Cited

U.S. PATENT DOCUMENTS

| | | | |
|---|---|---|---|
| 2,857,275 | 10/1958 | Land et al. | 430/251 |
| 3,179,517 | 4/1965 | Tregillus et al. | 430/206 |
| 3,253,923 | 5/1966 | Glover et al. | 430/414 |
| 3,464,822 | 9/1969 | Blake | 430/311 |
| 3,578,450 | 5/1971 | Miller et al. | 430/246 |
| 3,705,804 | 12/1972 | Farney et al. | 430/246 |
| 3,889,272 | 6/1975 | Lou | 430/346 |
| 3,911,444 | 10/1975 | Lou et al. | 346/1 |

Primary Examiner—Richard L. Schilling

[57] ABSTRACT

A reflective laser recording and data storage medium, for direct reading after writing, formed from a photosensitive silver-halide emulsion including silver precipitating nuclei. A single step negative silver diffusion transfer process is used to develop silver nuclei of the latent image and dissolve unexposed silver halide elsewhere, forming silver ion complexes. These complexes are transported by diffusion transfer to the developing silver nuclei sites where silver is precipitated and adsorbed to form a high concentration of non-filamentary particles at a surface of a low melting temperature dielectric matrix which is highly reflective of light and electrically non-conducting.

1 Claim, 13 Drawing Figures

REFLECTIVE DATA STORAGE MEDIUM MADE BY SILVER DIFFUSION TRANSFER IN SILVER-HALIDE EMULSION INCORPORATING NUCLEI

CROSS REFERENCE TO RELATED APPLICATION

This application is a division of application Ser. No. 55,270, filed July 6, 1979 by Eric W. Bouldin and Jerome Drexler.

BACKGROUND OF THE INVENTION a. Field of the Invention

The invention relates to laser recording media, and more particularly to a reflective silver data recording and storage medium useful for reading laser recordings immediately after laser writing which is made from a silver-halide photosensitive emulsion by diffusion transfer.

b. Prior Art

Previously, many types of optical recording media have been developed for laser writing. For example, an article in Optical Engineering, Vol. 15, No. 2, March-April, 1976, p. 99 discusses properties of a large number of media. Some of these media require post write processing before they can be read, and some can be read immediately after laser writing. The media of interest herein are for "direct read after write" capability, commonly known as "DRAW" media. Presently known laser DRAW media are thin metal films in which holes may be melted, composite shiny films whose reflectivity at a spot may be reduced by evaporation, thin films of dyes or other coatings which can be ablated at a spot, and dielectric materials whose refractive-index may be changed at a point, causing a scattering of light when scanned with a read laser.

The most common DRAW media are thin metal films, usually on a glass substrate. Thin metal films have several advantages: First, they can be produced easily in small quantities with commercially available sputtering equipment. Second, they can be read either by reflection or by transmission. Third, films of tellurium and bismuth have relatively high recording sensitivities.

Fortunately, for all of these reasons, metal films have enabled a large amount of research to be conducted and progress to be made in the design of optical data storage systems. To date, tellurium must be manufactured by an expensive, batch-type, vacuum sputtering technique, it does not form a tenacious coating; and it introduces manufacturing and environmental complications because of its toxicity and since it rapidly oxidizes in air it must be encapsulated in an airtight system in order for it to achieve an acceptable archival life.

What is particularly desirable about tellurium is that it has a low melting temperature for a metal, 450° C., and also a very low thermal conductivity of 2.4 watts per meter per degree Kelvin at 573° K. In comparison, silver metal has a melting temperature of 960° C. and a thermal conductivity of 407 watts per meter per degree Kelvin at the same elevated temperature. When these two metals are considered for laser recording with short pulses of laser power, the tellurium is far superior from a recording sensitivity standpoint since the low thermal conductivity keeps the heat generated by the laser beam confined to a small area and the lower melting temperature facilitates the melting of the hole. Conversely, silver metal, because of its high thermal conductivity, about 170 times that of tellurium, would not normally be considered suitable for laser recording.

Attempts have been made to improve the laser recording sensitivity of various types of metal layers. In U.S. Pat. No. 3,911,444 Lou, Watson and Willens disclose a vacuum-deposited metal film recording media for laser writing incorporating a separately deposited plastic film undercoat between the metal film and a flexible transparent substrate to thermally insulate the metal layer in order to require less energy to write with a laser.

Although it is possible to produce reflective metallic coatings of many types of substrates by vacuum sputtering or evaporation, silver is relatively unique in that it can also be created by photographic techniques and, in particular, by silver diffusion transfer. In U.S. Pat. No. 3,464,822 Blake discloses a silver diffusion transfer reversal process for creating electrically conducting silver images for the fabrication of printed circuit boards. That invention, in turn, is based upon silver diffusion transfer process inventions of the reversal type, leading to black non-reflective and non-conductive images, one example being U.S. Pat. No. 2,500,421 by Dr. E. H. Land. The silver diffusion transfer reversal process forms the basis of direct positives by the Polaroid Land process of Polaroid Corporation and the Gevacopy and Copyrapid processes of Agfa-Gevaert. These reversal processes should be distinguished from the silver diffusion negative process. One such process leading to black non-reflecting and non-conducting images, is described in U.S. Pat. No. 3,179,517 by Tregillus. A silver diffusion transfer negative process is used in the present invention.

It is well known that if very small, high electrical conductivity metal spheres or spherical particles are distributed through a dielectric medium, the effective dielectric constant or refractive index will rise owing to the added induced dipoles of the metal particles. For the case of homogeneously distributed particles, see Principles of Microwave Circuits, edited by C. G. Montgomery, McGraw Hill Book Company, Inc., 1948, pp. 376–397.

Previously, a reflective silver laser recording medium was the subject of a prior patent application Ser. No. 012,235 by J. Drexler. In that application, a processed black silver emulsion was converted to a reflective recording medium by heating at least to 250° C. until a shiny reflective appearance is achieved.

An object of the invention was to devise a non-toxic, reflective DRAW laser recording and data storage medium which may be manufactured without the use of a vacuum system and on a continuous basis and which may be used to record low-reflective spots in a reflective field with relatively low energy laser pulses. Another object was to devise a reflective laser recording and data storage medium which permits the pre-recording of control indicia and certain data base data by photographic means to facilitate the use of discs or plates in both the recording apparatus and the playback apparatus. Another object was to permit replication of optically recorded media by photographic contact printing on a rigid flexible substrate that can be read in reflection or transmission. Another object was to devise a laser recording and data storage medium which could be fabricated from commercially available photoplates and films or minor modifications thereto, to achieve low cost. Another object was to devise a laser recording medium which does not require a high temperature processing step and therefore will permit the use of ordinary, low-cost photographic plastic film bases or other available plastics as substrate materials permitting fabrication of recording discs with center holes by a low-cost stamping operation. Yet another object of this invention was to devise a single-step silver diffusion transfer photographic process which could produce a highly reflective electrically non-conducting surface layer having a thickness of 1 micron or less contained almost entirely within the gelatin or colloidal carrier.

SUMMARY OF THE INVENTION

The above objects have been met with the discovery that the silver in a photosensitive, silver-halide emulsion of a photoplate or film having a nuclei layer therein can be brought to a surface of the emulsion to form a reflective laser recording and storage medium by a novel single step silver diffusion transfer negative photographic process. The nuclei layer should precipitate silver and have a gradient of decreasing concentration in the depthwise direction. The present invention involves a single step monobath silver diffusion transfer development process for the emulsion that is primarily a solution physical development process which is used to build up the volume concentration of silver at the surface containing the precipitating nuclei until the surface becomes reflective.

This reflective surface layer is typically less than one micron thick; has a reflectivity of 15% to 50%; is electrically a non-conductor and thermally a poor conductor since the matrix is typically gelatin, which holds the high concentration of tiny particles and agglomerates of silver particles which are separated and isolated from each other by the gelatin matrix. Thus, although the layer reflects light like a metal, it melts easily like a plastic, with the result that its recording sensitivity is in the class of bismuth and tellurium and at least an order of magnitude more sensitive than that of a thin, continuous silver metal layer.

The nuclei always have a concentration which is greatest at the one surface of the emulsion and least in the interior of the emulsion. The surface of greatest concentration may be either the surface distal to the substrate or proximate thereto, depending on where laser writing will initially impinge on the medium. For example, if laser writing is on the upper surface, the emulsion surface distal to the substrate has the greatest concentration of exposed silver halide. During the original manufacture of the silver-halide photographic plate or film a very thin gelatin layer containing silver-precipitating nuclei would be included at the surface distal to or the surface proximate to the substrate, which would be the basis for creating a reflective surface at either of these two surfaces.

The principal step of the process involves contacting the exposed or activated and unexposed silver halide with a monobath containing a silver-halide developing agent for physically developing the nuclei. A silver-halide solvent in the monobath, preferably a soluble thiocyanate or ammonium hydroxide, reacts rapidly with unexposed and undeveloped silver-halide to form soluble complexed silver ions which are transported by diffusion transfer to the nuclei, where the silver in the complexed silver ions is precipitated in the presence of the silver halide developing agent. This process forms a reflective silver image. Recording is accomplished by puncturing through the reflective component with a laser beam so as to create a hole in the reflective component which may later be detected by a variety of means such as reduced reflection of the hole; scattering of light from the hole; increased light transmission through the hole; and, if the recording is done on the surface distal to the substrate, detection may be accomplished by means of mechanically probing the surface relief image of the hole.

An advantage of the above method for making a reflective recording medium is that it allows a low-cost manufacturing process to create a precise very thin patterned reflective silver layer on the medium which could be used for laser recording without resorting to high-temperature processes which could limit the selection of substrate materials. Several embodiments of the present method may be carried out by continuous manufacturing operations, as opposed to batch operations, but batch procedures may also be used.

DESCRIPTION OF THE PREFERRED EMBODIMENT

The reflective laser recording medium of the present invention is made in one principal step involving silver diffusion transfer.

I. Surface Latent Image Formation

During the original manufacture of the silver-halide photographic plate or film a very thin gelatin layer containing silver-precipitating nuclei would be included at the surface distal to or the surface proximate to the substrate, which would be the basis for creating a reflective surface at either of these two surfaces. To record control indicia on the medium, part of the emulsion may be masked or alternatively may have been exposed and chemically developed black. Typically such a medium is a disk, as illustrated in FIG. 1; however it could be a plate or film strip.

Figure 1:
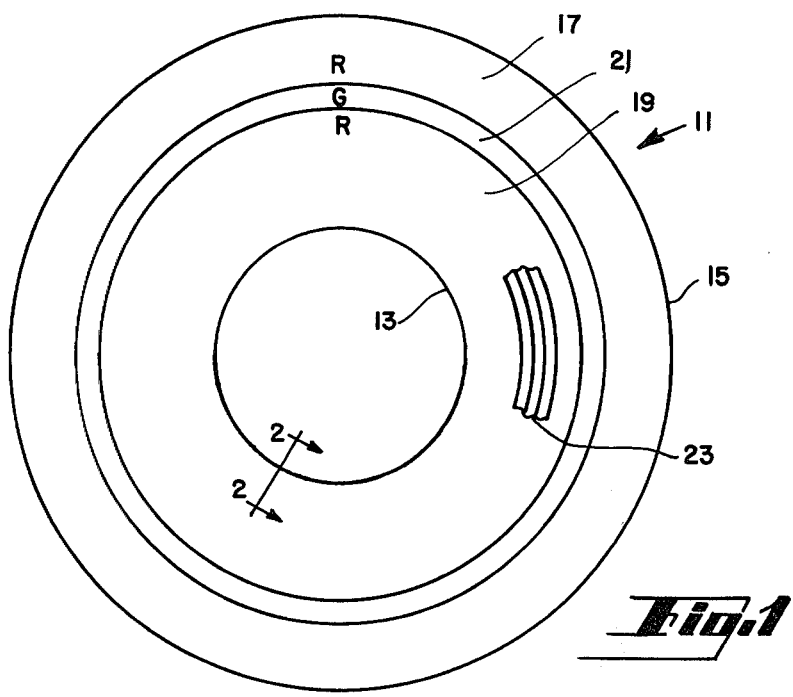
FIG. 1 is a top plan view of the recording medium of the present invention.

FIG. 1 shows a disc 11 having an inner periphery 13 and an outer periphery 15. The interior of the inner periphery 13 is void so that a centering collar may be used to hold disc 11 on a spindle for high speed rotation. While the recording medium of the present invention is described as a disc, a disc configuration is not essential for operating of the recording medium. For example, the recording medium may be a flat sheet-like material which could be square and with a central hub rather than a hole. It could also be a non-rotating rectangular plate. However, rotating discs are preferred for fast random access to medium amounts of data and non-rotating rectangular plates in stacks are preferred to provide intermediate speed random access to large amounts of data by mechanically selecting a plate and scanning it by mechanical and electro-optical means.

The disc of FIG. 1 is photographically partitioned into recording and non-recording areas. For example, a first annular recording zone 17 could be spaced from a second annular recording zone 19 by an annular guard zone 21. The function of the guard zone may be to separate different recording fields, to carry control information, such as timing signals and to provide space for data read-write transducers to reside when not over recording areas. While such guard bands are preferable, they are not essential to the operation of the present invention. It should be noted that the recording fields are for data and control signal recording, while the guard band is not for data recording, but may have control signal recording thereon. The recording field 19 is shown to have a plurality of concentric, circumferentially-spaced servo guides 23 thereon. Such servo guides are thin lines which define the spaces between circular paths wherein data are written. The pattern for such lines is applied photographically as explained below with reference to FIGS. 3-8.

Figure 2:
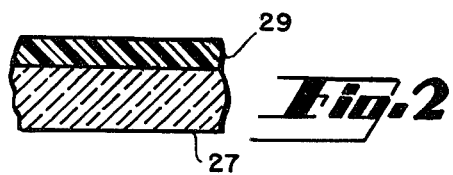
FIG. 2 is a side sectional view of the recording medium of FIG. 1, taken along lines 2—2.

FIG. 2 shows a side sectional view of the recording medium of FIG. 1. The medium consists of a substrate 27 which is a sheet-like layer which may be transparent or translucent, preferably a dimensionally stable material, like glass or plastics used for photographic film bases. Opaque, light-absorptive materials will work in those applications of the present invention where light transmission through the substrate is not desired. Transparency or absorptivity of the substrate is desired so that when the light beam of the reflective playback apparatus impinges upon a recorded spot, it either passes through the substrate or is absorbed by it with minimum reflection. If the substrate is absorptive, it may be absorptive at the wavelengths of the recording beam or the reading beam, or preferably both. The most common photographic film bases are polyester polyterephthalate, polycarbonate, or cellulose triacetate.

Figure 9:
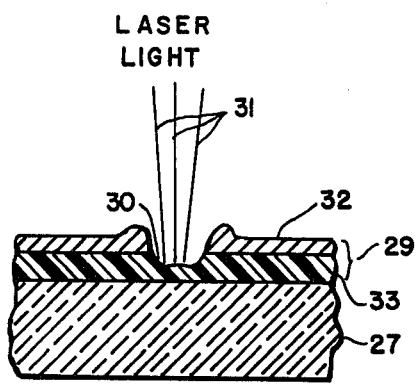
FIGS. 9-11 are side sectional views of three versions of the recording medium of FIG. 1 showing methods of laser reading or writing.
Figure 10:
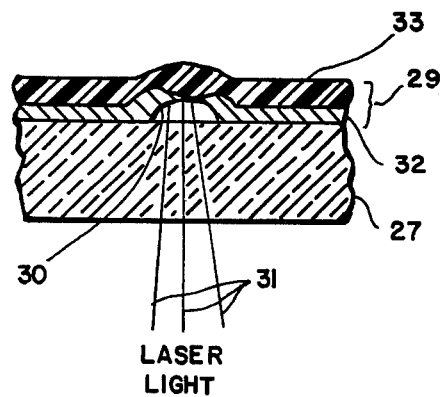
Figure 11:
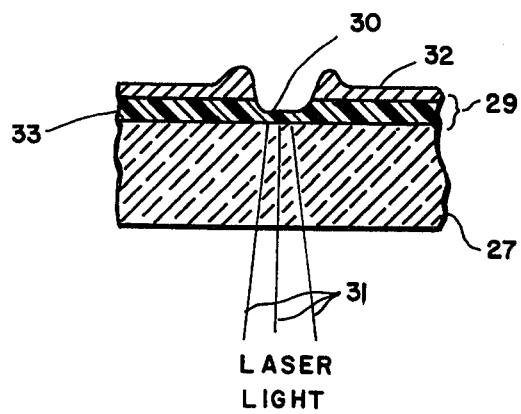

For the case where the substrate is transparent and not birefringent, recording and reflective reading of the data can be done through the substrate as shown in FIGS. 10 and 11, or from the side distal to the substrate as shown in FIG. 9. For transmissive read, the configurations of FIGS. 10 and 11 may be used. If the substrate is absorptive then reflective read is the only possibility and the configuration of FIG. 9 would be used.

The thickness of the substrate is not critical when the laser beam is directed onto the surface as shown in FIG. 9, but it should have sufficient thickness to provide strength for resistance against breakage. If the laser beam is directed through a transparent substrate, as in FIGS. 10 and 11, then in order to maintain focus of the beam the thickness of the transparent substrate would have to be very uniform (for example, as obtainable from float glass or selected high quality drawn glass). Also, the thickness of the substrate may depend on the overall size of the recording medium being used. For a 12-inch disc, a thickness of ⅛ inch may be suitable.

The purpose of substrate 27 is to support a silver-halide emulsion coating 29, which is uniformly applied to the substrate in a conventional manner and which is converted by silver diffusion transfer into components 32 and 33 in FIGS. 9, 10 and 11. This process for creating the reflective layer 32 does not require any chemical constituent within the emulsion other than a conventional silver halide held in a suitable colloid carrier, preferably gelatin. They may also contain optical and chemical sensitizers, anti-fogging agents, stabilizing compounds, emulsion hardeners and wetting agents. However, when commercial photoplates or films are used, they may contain certain physical characteristics or added chemical ingredients which could lead to favorable or unfavorable results. For example, most photographic films have a gelatin overcoat over the silver-halide emulsion that might have a thickness of 1 micron. Since layer 32 is not electrically conducting but reflects owing to its high dielectric constant, any moderately thick, high dielectric constant coating over it will reduce its reflectivity.

One of the advantages of gelatin is that it has a relatively low melting temperature, less than 400° C., which aids laser recording. Such low melting temperature carriers are preferred in the present invention.

Emulsion thicknesses of 3 to 6 microns are adequate to contain sufficient silver-halide emulsion to build up the reflective layer by the complexing and diffusion transfer steps. If thicker commercial emulsions are used along with long processing times, the reflective layer may become too thick or too thermally conducting to permit recording with low-power lasers. The thicker coating requires a higher laser beam power to penetrate it and a higher thermal conductivity leads to faster heat flow away from the spot being recorded, also leading to higher recording powers.

If a hardened emulsion is desired it may be preferable to harden or cross link the gelatin after forming reflective layer 32. If the emulsion is hardened initially, then it will swell to a reduced extent during monobath processing thereby reducing the rate at which the silver halide is dissolved and complexed, thus extending the process time.

Small silver-halide grains typically found in commercially available high resolution or high definition photoplates used in photomask making, holography and high-resolution recording are excellent for producing reflective laser-recording materials. These emulsions typically have mean grain sizes of 0.05 micron and a spread of about 0.007 micron. One type, the Agfa-Gevaert Millimask HD photoplate, has a mean grain size of 0.035 micron and a spread of 0.0063 micron. The finer grains result in minimizing the micro variations or granularity in reflectivity and thickness of the reflective component and thereby permit recording and reading of smaller holes than for coarse grain emulsions. The finer grain emulsions also dissolve faster owing to their greater surface-to-volume ratio which leads to a shorter process time.

High resolution emulsion coated glass plates having these characteristics are commercially available and are known as photoplates which are used to make photomasks for the manufacture of semiconductor integrated circuits. For example, emulsion coated photoplates suitable for use herein are manufactured by Agfa-Gevaert of Belgium, Konishiroku Photo Industries Co., Ltd. of Japan and the Eastman Kodak Company. However these commercial products do not contain silver precipitating nuclei and any of these products could be converted during the emulsion coating processes.

The shiny reflective component 32 in FIGS. 9, 10 and 11 result from the photographic monobath processing described herein but the silver is present initially as silver halide and reflectivity does not initially exist in the emulsion. Thus at the inception the silver of reflective component 32 is found in the photographic emulsion 29, which is uniform in its composition. An inert subbing layer, not shown, is usually used to attach the substrate 27 to the emulsion 29. Following the photographic conversion of the present invention the emulsion 29 of FIG. 2 produces a reflective component 32 at the emulsion surface shown in FIG. 9, with a low-reflective underlayer 33 beneath it. The reflective layer 32 is sharply defined in thickness due to nuclei being included during manufacturing.

If any light exposure occurs in underlayer 33, prior to chemical processing, the underlayer, while not completely depleted of silver, contains much less silver than reflective component 32. Optically, underlayer 33 is either clear or reddish in color which is transmissive to red light having wavelengths of 630 nanometers and longer. Underlayer 33 tends to be clear or slightly yellow if the silver-halide therein is not subject to light exposure. Underlayer 33 tends to be amber or red if light exposure occurs in the underlayer.

Owing to the dielectric constant of the glass a higher volume concentration of silver is necessary to give the same reflectivity as compared to an emulsion side reflective layer. The required layer of high concentration silver precipitating nuclei at the substrate or distal to the substrate can also be incorporated during the film or photoplate manufacturing process.

Once craters are created penetrating reflective component 32, the data contained in the craters may be read by changes in reflectivity of the shiny reflective component throughout the visible spectrum and into the near infrared where it is ultimately limited in its usability as reflective component 32 becomes more and more transparent and therefore less reflective. The craters also may be detected by transmission of red light, provided that the opacity of the reflective layer is sufficiently great at the selected wavelength to permit detection of the craters through differences in light transmission.

It should be noted that both the recording areas 17, 19 and the non-recording guard band 21 of FIG. 1 initially have silver-halide emulsion covering a substrate. Thus, the designation of recording and non-recording areas is arbitrary and the entire surface could be used for recording if desired. However, as a matter of convenience, it is preferable to designate areas as non-recording areas. The boundaries between recording and non-recording areas may be defined by concentric lines, just as the servo guides 23 of FIG. 1, which have been greatly enlarged in the Figure, may be defined by lines. Typically, servo guides are closely spaced concentric circles or adjacent lines of a spiral, with data being written on or between the lines. Such servo guide lines, as well as line boundaries for non-recording areas, may be photographically recorded on the recording medium prior to any data recording. Moreover, other alphanumeric information or data base information which is to be a permanent part of the recording medium also may be applied to the recording medium photographically at an early time in the processing cycle since it becomes a permanent part of the recording medium.

One of the advantages of the present invention is that the permanent information to be pre-recorded on the recording medium of the present invention may be applied by photographic techniques since the starting material for the recording medium is an unexposed commercially available photoplate used in the manufacture of semiconductor integrated circuits or film-based materials of similar quality. A principal characteristic of silver-halide emulsion photosensitive materials for use in the present invention is fine grain size so that the reflectivity granularity is minimized and very small holes can exhibit measurable changes in reflectivity. Large grain sizes would lead to greater granularity which would tend to mask changes in reflection created by small holes. Pre-recording of information may be achieved by masking off areas as described herein. After photographic processing, this pre-recorded information may be read in reflection since the pre-recording areas will consist of either highly reflective white silver areas or low reflective black silver areas or low reflectivity clear gelatin areas.

The photographic techniques which may be used to prerecord data base and control information are closely related to the fabrication of emulsion photomasks in the semiconductor industry. Lines having a thickness of one micron may be made using these photomask manufacturing techniques. Some procedures for creating a pre-recorded line pattern are illustrated in FIGS. 3–8.

Figure 3:
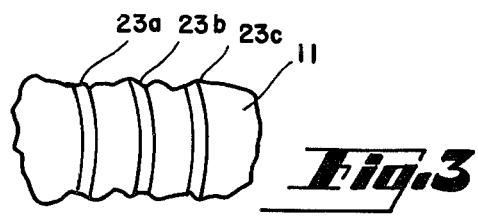
FIGS. 3-8 are detail views of the recording medium of FIG. 1 showing the results of different combinations of photographic processing steps for making the finished recording medium.
Figure 4:
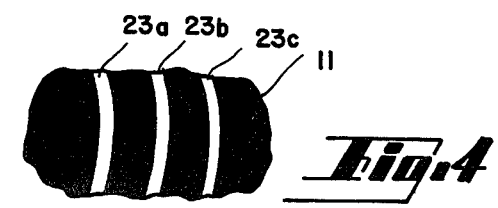
Figure 5:
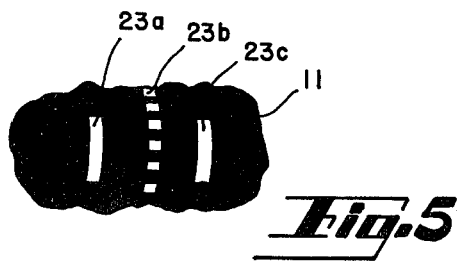

With reference to FIG. 3, fine grain silver-halide emulsion medium 11 is exposed to actinic radiation in the areas for non-data recording but the line pattern consisting of the circular lines 23a, 23b and 23c is masked from the radiation. This procedure creates a surface latent image formation in the non-data recording areas. The masked areas are then unmasked and the emulsion is subjected to a standard chemical development process to develop medium 11 black. Then the medium is subjected to the monobath processing described herein which creates a reflective surface for laser recording on 23a, 23b, 23c in FIG. 4. The black area in this figure represents black silver and the white areas represent reflective silver.

There is a principal reason that the silver can be concentrated at the surface distal to the substrate. When the emulsion is dipped into the monobath the surface silver precipitating nuclei are immediately available for solution physical development. Thus, when the solution physical development of the monobath begins, complexed silver ions will precipitate on the surface where the silver precipitating nuclei are numerous.

The circular lines 11 which were developed black represent low reflectivity servo guides which would provide information as to whether the recording laser is recording on the data track or has moved off the edge of the data track. To provide additional information to the servo system, the servo guides could contain a reflective and non-reflective pattern shown in FIG. 5, which would provide information as to whether the correction requires a movement to the right or left. Note that the right and left servo guides would provide different frequency signals to the playback system. The dashed pattern shown could be created in the master by means of a photomask or by interrupting a laser photographic recording beam.

Figure 6:
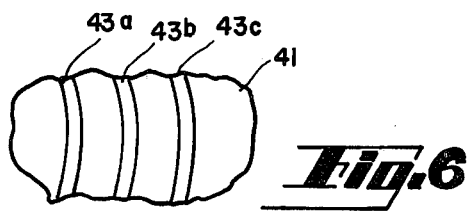
Figure 7:
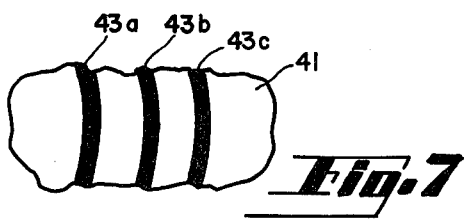
Figure 8:
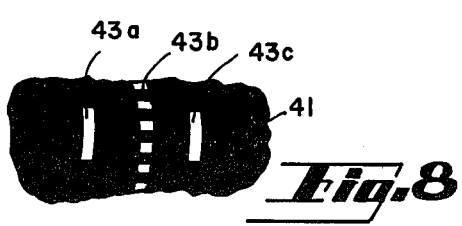

For the servo guides or any other indicia markings to be in the form of low reflective black silver, as opposed to clear gelatin markings discussed above, the servo guides themselves could be exposed through a mask or by means of a continuous or interrupted laser beam. FIG. 6 illustrates the making of such indicia where actinic radiation is used first to expose servo guides 43a, 43b, 43c and the remaining area 41 would be shielded. Then a normal chemical or direct development would be used to create a black low reflectivity pattern as shown in FIG. 7. No fixing would be used since the silver halide in region 41 would be used in the subsequent monobath processing to create reflective areas. Also note that the lines 43a, 43b, and 43c could have been broken into a pattern such as those shown in FIG. 5. With the track guides and possibly other indicia recorded in black silver, the next step would be to expose the surface latent image in the remaining areas for laser recording.

The commercially available instant photographic films of the Polaroid-Land photographic system have silver-precipitating nuclei layers in contact with the silver-halide emulsion. Note that the use of silver-precipitating nuclei layers incorporated in the emulsion does not preclude the possibility of pre-recorded control indicia. The non-data recording areas may be exposed first and chemically developed to low reflectivity black silver and not fixed. The entire plate is then given a monobath development to create reflective data recording areas. If desired, the black silver areas created by the initial exposure and development could be bleached out before monobath processing. The reflective component 32 of FIGS. 9–11 is thus derived from the silver in the silver-halide emulsion.

A commercially available photographic emulsion containing nuclei is the starting material for creating the laser-recording medium in the present invention, and the finished product may be considered to be silver particles in a gelatin dielectric matrix, the halide being removed in the monobath processing.

To use the laser recording medium of the present invention, laser light is focused on a spot on the reflective component either from the side distal to the substrate or through a transparent substrate. For laser recording as opposed to data storage applications the reflectivity of the reflective layer preferably ranges between 15% and 50%; thus, the remaining percentage of incident radiation of 85% to 50% is either absorbed by the reflective component or partly passes through it. The absorbed power distorts or melts the gelatin supporting the reflective component so as to reduce the reflectivity at the spot and create an adequate contrast in reflective reading of the recorded data. For data storage applications, i.e., laser reading but not recording the reflectivity may be as high as possible and the thickness of the reflective layer is not critical. The reflective component 32 is located on the underlayer as shown in FIG. 9 and FIG. 11 and adjacent to the substrate as shown in FIG. 10. In all three cases a reflective read procedure can be used—for example, as described in U.S. Pat. No. 3,657,707. In the cases shown, the recording laser beam need only effect the reflective component, and further penetration into component 33 is not needed.

In FIG. 9, the substrate could be either transmissive or opaque if reflective read is used, but must be transmissive to the read laser beam if transmissive read is used. The component 33 would be essentially clear gelatin if the emulsion had been manufactured with a silver precipitating nuclei layer included. If component 33 is essentially clear gelatin it would permit transmissive reading of data.

FIG. 10 illustrates a configuration produced by use of an emulsion which has been manufactured with a silver precipitating nuclei layer included. Thus, component 33 is essentially clear gelatin and transmissive read can be accomplished.

FIG. 11 illustrates a configuration where both the substrate and the underlayer are transmissive to visible and near infrared radiation. It has the advantage that layer 32 can be coated with a non-optical flat protective layer which would serve to encapsulate layer 32. This type of protective layer could not be used in the configuration of FIG. 9 because it would be in the optical path. The configuration of FIG. 11 also offers an advantage over the configuration of FIG. 10 in that higher reflectivities are more easily attainable by use of the herein described process. The essentially clear gelatin component 33 can be produced by use of an emulsion which had been manufactured with a silver precipitating nuclei layer included at the location of layer 32. In this case in addition to reflective read at visible wavelengths and near infrared, the component 33 also permits transmissive read at these wavelengths by laser light traversing substrate 27 for transmission through the essentially clear gelatin component 33 and through crater 30 in component 32.

FIGS. 9, 10 and 11 show emulsion coating 29 on substrate 27 covered by shiny component 32 having a crater 30 damaging the shiny component created by means of laser light indicated by the rays 31. The size of the craters is kept at a minimum, preferably about one micron in diameter but no larger than a few microns in diameter to achieve high data densities. Data written by means of laser light are recorded in the recording areas 17, 19 shown in FIG. 1, designated by the letter R. As mentioned previously, these recording areas may also contain pre-recorded data base data and control indicia which may be disposed over essentially the entire area of the medium. No data is recorded in the guard band 21, designated by the letter G, although this region may have control indicia written therein. Control indicia in either of the areas may be written by means of photographic techniques or by pyrographic methods such as laser writing.

Thus, the recording medium of the present invention may contain a mix of pre-recorded data and control indicia which has been applied to the recording medium by photographic techniques, as well as subsequently written data applied to the recording medium by laser pyrographic writing. There need be no data storage distinction between the photographically pre-recorded non-reflective spots and non-reflective spots made by laser writing. In the recording mode the pre-recorded control information is used to determine the location of the data craters being recorded.

II. Silver Diffusion Transfer

We have found that a very thin, highly reflective, silver surface may be formed by the diffusion transfer of appropriate complexed silver ions to a layer of silver precipitating nuclei. This reflective layer is electrically non-conducting and has low thermal conductivity and may be patterned photographically, these latter two properties being highly desirable for laser recording media. The complexed silver ions are created by reaction of an appropriate chemical and the silver halide used in conventional silver-halide emulsions. A developing or reducing agent must be included in this solution to permit the complexed silver ions to be precipitated on the nuclei layer. This combination of developing agent and silver complexing solvent in one solution is called a monobath solution. Preferred monobath formulations for highly reflective surfaces include a developing agent which may be characterized as having low activity. The specific type of developing agent selected appears to be less critical than the activity level as determined by developer concentration and pH.

The developing agent should have a redox potential sufficient for causing silver ion reduction and adsorption or agglomeration on silver nuclei. The concentration of the developing agent and the pH of the monobath should not cause filamentary silver growth which gives a black low reflectivity appearance. The developed silver particles should have a geometric shape, such as a spherical or hexagonal shape which when concentrated form a good reflectivity surface.

Developing agents having the preferred characteristics are well known in the art and almost any photographic developing agent can be made to work by selection of concentration, pH and silver complexing agent, such that there is no chemical reaction between the developing agent and complexing agent. It is well known that photographic developing agents require an antioxidant to preserve them. The following developing agent/antioxidant combinations produced the typical indicated reflectivities for exposed and monobath developed Agfa-Gevaert Millimask HD photoplates.

| For Monobaths Using Na(SCN) As a Solvent And Silver Complexing Agent | | |
|---|---|---|
| Developing Agent | Antioxidant | Approximate Maximum Reflectivity |
| p-methylaminophenol | Ascorbic Acid | 46% |
| p-methylaminophenol | Sulfite | 37% |
| Ascorbic Acid | — | 10% |
| p-Phenylenediamine | Ascorbic Acid | 24% |
| Hydroquinone | Sulfite | 10% |
| Catechol | Sulfite | 60% |

| For Monobaths Using NH4OH As a Solvent And Silver Complexing Agent | | |
|---|---|---|
| Developing Agent | Antioxidant | Typical Reflectivity |
| Hydroquinone | Sulfite | 25% |
| Catechol | Sulfite | 30% |

The preferred solvents/silver complexing agents, which must be compatible with the developing agent, are mixed therewith, in proportions promoting the complete diffusion transfer process within reasonably short times, such as a few minutes. Such silver complexing agents in practical volume concentrations should be able to dissolve essentially all of the silver halide of a fine grain emulsion in just a few minutes. The solvent should not react with the developing silver grains to dissolve them or to form silver sulfide since this tends to create non-reflective silver. The solvent should be such that the specific rate of reduction of its silver complex at the silver nuclei layer is adequately fast even in the presence of developers of low activity, which are preferred to avoid the creation of low-reflectivity black filamentary silver in the initial development of the surface latent image.

The following chemicals act as silver-halide solvents and silver complexing agents in solution physical development. They are grouped approximately according to their rate of solution physical development; that is, the amount of silver deposited per unit time on precipitating nuclei, when used with a p-methyl-aminophenol-ascorbic acid developing agent.

Most Active

Thiocyanates (ammonium, potassium, sodium, etc.)
Thiosulphates (ammonium, potassium, sodium, etc)
Ammonium hydroxide

Moderately Active

α picolinium—β phenylethyl bromide
Ethylenediamine
2-Aminophenol furane
n-Butylamine
2-Aminophenol thiophene
Isopropylamine

Much Less Active

Hydroxylamine sulfate
Potassium chloride
Potassium bromide
Triethylamine
Sodium sulfite From the above it can be seen that the thiocyanates and ammonium hydroxide are amongst the most active solvents/complexing agents. While almost all developers suitable for solution physical development can be made to work in the silver diffusion transfer process of the present invention with the proper concentration and pH, not all solvents/complexing agents will work within the desired short development time or in the proper manner. For example, the thiosulfate salts, the most common silver-halide solvent used in photography in Polaroid-Land black and white instant photography's diffusion transfer process, does not work in this process for two reasons. Its complexed silver ions are so stable that it requires a strong reducing agent to precipitate the silver on the nuclei, and this strong reducing or developing agent would have the undesirable effect of developing low reflective black filamentary silver. It has another undesirable effect, also exhibited by the solvent thiourea; namely, that it forms black, low reflecting silver sulfide with the developing silver grains. On the other hand in the black and white Polaroid-Land process black silver is a desirable result. Sodium cyanide is not recommended, even though it is an excellent silver-halide solvent, because it is also an excellent solvent of metallic silver and would thus etch away the forming image. It is also about 50 times as toxic as sodium thiocyanate, which is a common photographic reagent.

The process chemicals can be applied by a variety of methods, such as by immersion, doctor blades, capillary applicators, spin-spray processors and the like. The amount of processing chemicals and temperature thereof should be controlled to control reflectivity. Preferably, the molar weight of the developing agent is less than 7% of the molar weight of the solvent since higher concentrations of developing agent can lead to low reflective filamentary silver growth, exceptions to this ratio being found among p-phenylenediamine and its N, N-dialkyl derivatives having a half-wave potential between 170 mv and 240 mv at a pH of 11.0, which have lower development rates and require higher concentrations, i.e., up to 15 grams per liter and minimum of about 2 grams per liter. These derivatives and their half-wave potentials are listed in Table 13.4 of the book entitled The Theory of the Photographic Process, 3rd ed., Macmillan Company (1966). The concentration of the solvent in the form of a soluble thiocyanate or ammonium hydroxide should be more than 10 grams per liter but less than 45 grams per liter. If the concentration is too low the solvent would not be able to convert the halide to a silver complex within a short process time and if the solvent concentration is too great the latent image will not be adequately developed into the necessary silver precipitating nuclei causing much of the silver complex to stay in solution rather than be precipitated. The process by which the silver complex is reduced at the silver precipitating nuclei and builds up the size of the nuclei is called solution physical development.

It is important to note that in solution physical development, as used herein, the silver particles do not grow as filamentary silver as in direct or chemical development, but instead grow roughly equally in all directions, resulting in a developed image composed of compact, rounded particles. As the particles grow, a transition to a hexagonal form is often observed. If the emulsion being developed has an extremely high density of silver nuclei to build upon and there is sufficient silver-halide material to be dissolved, then eventually the spheres will grow until some contact other spheres forming aggregates of several spheres or hexagons. As this process takes place the light transmitted through this medium initially takes on a yellowish appearance when the grains are very small. This changes to a red appearance as the particles build up in size and eventually will take on a metallic-like reflectivity as the aggregates form.

In summary, it was discovered that if silver precipitating nuclei are formed on one of the surfaces of a silver-halide emulsion either in the emulsion manufacturing process, and if this emulsion is then developed in a monobath solution containing a weak developer and a very fast solvent which forms complexed silver ions which are readily precipitated by catalytic action of silver nuclei; and if the solvent does not form silver sulfide; then a reflective coating is developed on one of the emulsion surfaces thereby creating a medium for data storage and laser recording. It was also discovered that any of the common developing agents will work whereas only a small number of solvents/complexing agents have all of the desired properties, the most successful of these being the soluble thiocyanates and ammonium hydroxide.

In a common version of the black and white silver diffusion transfer process the silver in the unused halide in the negative image will diffuse to a second separatable layer containing precipitating nuclei for reducing the silver and thereby creating a positive image. In the diffusion transfer process of this invention, a volume concentration of silver precipitating nuclei are located on an emulsion surface without use of a separate layer containing nuclei. The developing agent-solvent monobath performs two functions; it dissolves the silver halide within the body, creates complexed silver ions and provides the reducing agent necessary for the solution physical development process, that is, the reduction and precipitation of the complexed silver ions on the silver precipitating nuclei.

Thus, the key steps in the present invention involve adding a layer of silver-precipitating nuclei to the emulsion during the manufacturing process and then using a special monobath containing a developing agent and complexing agent to build up the silver grains of the silver precipitating nuclei until they begin to aggregate into groups thereby increasing the volume concentration of the silver in the surface latent image area until it becomes adequately reflective. An alternative procedure is to use a silver-halide emulsion which is coated on one side by, or otherwise incorporates a layer of, silver precipitating nuclei which is then exposed to light in the non-data-recording areas assigned to control indicia. This is then followed by a chemical development to produce black control indicia or other pre-recordings and finally a monobath development of the special type previously described is used to build up the silver grains in the data recording area until it becomes adequately reflective. The resulting reflective laser-recording and data storage medium consists of concentrated reflective silver grains near a surface of an essentially clear gelatin matrix.

Some of the key processing steps of the present invention may be achieved by physical phenomenon, chemical treatments or manufacturing techniques but when these steps are linked together in the proper processing sequence, the result is a reflective laser-recording medium. Table I presents 14 experimental examples to illustrate some of the variations of the individual steps that may be used and to present an overview of two principal steps necessary to create a laser recording media of adequate reflectivity. In these examples actinic radiation or a surface fogging chemical were used to create silver precipitating nuclei.

See Table I which follows.

TABLE I

| Example | Surface Activation | Developing Agent | Solvent/Complexing Agent | Photographic Material | Typical Reflectivity |
| --- | --- | --- | --- | --- | --- |
| Example 1 | Light | P-Phenylendiamine | Sodium Thiocyanate | Agfa HD Photoplate;* 4½ Micron Emulsion | 20%–24% |
| Example 2 | Light | P-Methylaminophenol and Ascorbic Acid | Sodium Thiocyanate | Agfa HD Photoplate; 4½ Micron Emulsion | 20%–35% |
| Example 3 | Light | P-Methylaminophenol and Ascorbic Acid | Sodium Thiocyanate | Konishiroku ST Photoplate; 3 Micron Emulsion | 15%–27% |
| Example 4 | Light | P-Methylaminophenol and Ascorbic Acid | Sodium Thiocyanate | Agfa-Gevaert Type 10E75 film; 5 Micron Emulsion | 40%–43% |
| Example 5 | Aqueous Hydrazine Surface Fogging | P-Methylaminophenol and Ascorbic Acid | Sodium Thiocyanate | Kodak S0173 Film; 6 Micron Emulsion | 32% |
| Example 6 | Aqueous Hydrazine; Surface Fogging | P-Methylaminophenol and Ascorbic Acid | Sodium Thiocyanate | Agfa HD photoplate; 4½ Micron Emulsion | 39%–41% |
| Example 7 | Aqueous Hydrazine; Surface Fogging | P-Methylaminophenol and Ascorbic Acid | Sodium Thiocyanate | Konishiroku SN Photoplate; 6 Micron Emulsion | 23% |
| Example 8 | Gaseous Hydrazine; Surface Fogging | P-Methylaminophenol and Ascorbic Acid | Sodium Thiocyanate | Agfa HD Photoplate; 4½ Micron Emulsion | 22% |
| Example 9 | Aqueous Potassium Borohydride; Surface Fogging | P-Methylaminophenol and Ascorbic Acid | Sodium Thiocyanate | Agfa HD Photoplate; 4½ Micron Emulsion | 75% |
| Example 10 | Light | P-Methylaminophenol and Ascorbic Acid | Hydroxylamine Hydrochloride | Agfa HD Photoplate; 4½ Micron Emulsion | 18% |
| Example 11 | Light | Catechol 1 gms./liter | Sodium Thiocyanate | Agfa HD Photoplate; 4½ Micron Emulsion | 56% |
| Example 12 | Light-Micron Image | Catechol ½ gm./liter | Sodium Thiocyanate | Agfa HD Photoplate; 4½ Micron Emulsion | 35% |
| Example 13 | Light | Catechol ½ gm./liter | Ammonium Hydroxide | Agfa HD Photoplate; 4½ Micron Emulsion | 30% |

TABLE I-continued

| Example | Surface Activation | Developing Agent | Solvent/Complexing Agent | Photographic Material | Typical Reflectivity |
|---|---|---|---|---|---|
| Example 14 | Light | Hydroquinone ½ gm./liter | Ammonium Hydroxide | Agfa HD Photoplate; 4½ Micron Emulsion | 25% |

*Agfa HD is an abbreviation for Agfa-Gevaert Millimask HD Photoplate.

In the following fourteen examples creation of nuclei in surface latent images was achieved by actinic radiation, aqueous and gaseous fogging by hydrazine and aqueous fogging by potassium borohydride. The nuclei formed in this manner are analogous to a nuclei layer added in the manufacture of the emulsion. As previously mentioned, if a nuclei layer is already present and pre-recordings are desired, then surface latent images must be created in the non-data recording areas. It appears that any silver halide emulsion may be used to create a reflective silver surface. This invention is not limited to the use of gelatin-based emulsions. Other film-forming colloids may be used as carriers. A variety of commercially available high-resolution films and plates manufactured by three different companies were used to illustrate the general nature of the process. It is also shown that the monobath developing-agent-complexing agent can be formulated by use of a variety of developing agents and solvents/silver complexing agents. Table I lists four different developing agents, three different solvents/complexing agents, five different emulsions and four different surface activation procedures. The reflectivities achieved range between 15% and 75%.

EXAMPLE 1

A photoplate coated with a commercial Agfa-Gevaert HD emulsion 4.5 microns thick and containing a screening dye was exposed to sunlight for several minutes and then immersed for five minutes at 23° C. in a monobath which contained the following formulation: p-phenylenediamine, 5.4 grams; 1-ascorbic acid, 5.0 grams; KBr, 0.5 grams; and NaSCN, 10.0 grams; with water added to bring volume up to 1 liter; and with a pH=11 achieved by adding NaOH. After drying, samples exhibited a range of reflectivities of 20% to 24% at 633 nanometers and a range of optical densities measured in the red with a commercial densitometer of 1.0 to 1.2.

Figure 12:
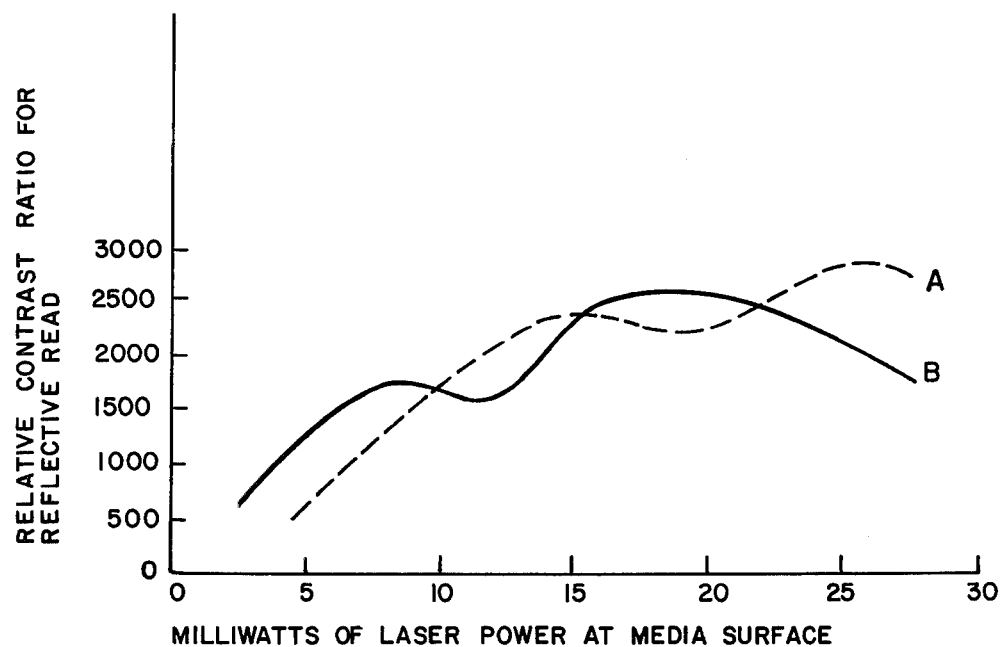
FIG. 12 is a plot of relative contrast ratio versus laser power for two materials.

Laser recording was then accomplished with an argon laser using the green line at 514 nanometers. The beam diameter was approximately 0.8 micron at the media surface, and pulse lengths of 100 nanoseconds were used. Tests were conducted to determine how the reflective contrast ratio varied with laser-beam power. Measurements were made starting at beam powers of 28 milliwatts and down to under 5 milliwatts. The results of those tests for two samples are shown as curves "A" and "B" in FIG. 12. The ratio of reflected power from the unrecorded surface to that of the hole at 24 milliwatts was in the range of 7:1 or 8:1. At each measured power level, the contrast was measured at 32 points and averaged.

EXAMPLE 2

Figure 13:
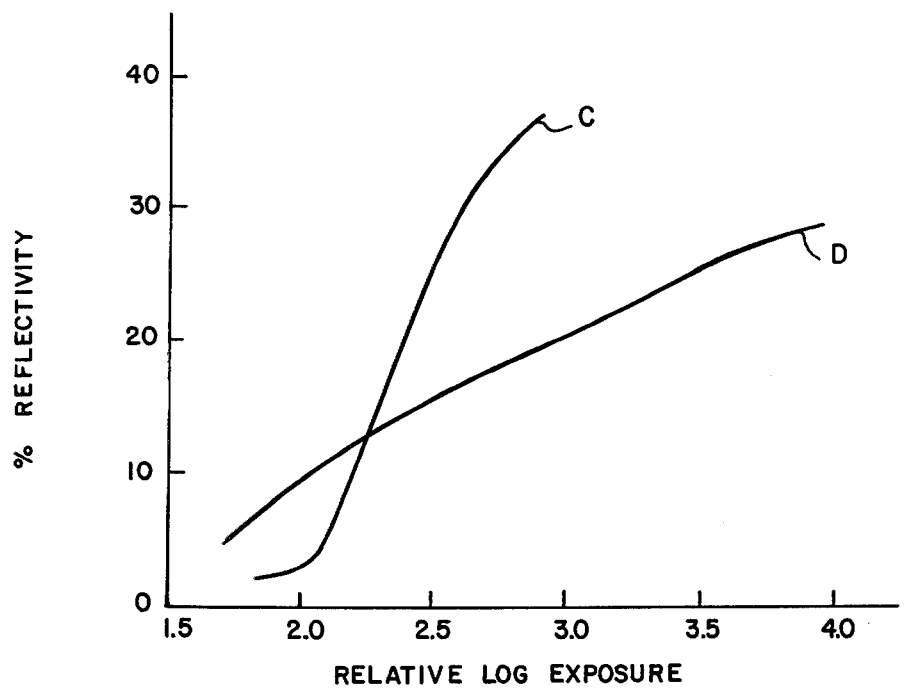
FIG. 13 is a plot of percent reflectivity versus exposure for two materials.

A photoplate coated with a commercial Agfa-Gevaert Millimask HD emulsion 4.5 microns thick and containing a screening dye was exposed in an exposure box through a stepped wedge stepped in optical density units of 0.1 to produce ten exposure levels. Four sequential exposures were used, after which the plate was developed for five minutes at 23° C. in a monobath consisting of p-methylaminophenol sulfate, 0.28 grams; 1-ascorbic acid, 2.8 grams; $KB_R$, 1.0 grams; NaOH, 2 grams; NaSCN, 22.0 grams; in a volume of 1 liter after adding water. The pH was 11. After drying, the reflectivity measured at 633 nanometers as a function of log exposure is shown in FIG. 13 as curve "C".

EXAMPLE 3

A photoplate coated with a commercial Konishiroku ST emulsion 3 microns thick containing no screening dye and with the backing removed was exposed in an exposure box through a stepped wedge stepped in optical density units of 0.1 to produce ten exposure levels. Three plates were used. The first plate was exposed to one flash of actinic radiation; the second, to four; and the third, to sixteen. The plates were then developed in the monobath described in Example 2. The processing time was 5 minutes at 23° C. After drying, the reflectivity measurements were made on the ten reflective steps on each of the three plates at 633 nanometers as a function of log exposure and are shown in FIG. 13 as curve "D". The curve covers a much greater range of log exposure than curve "C" because "D" interconnects the data taken from the three plates subject to different exposures, while "C" represents only one plate.

EXAMPLE 4

A strip of Agfa-Gevaert 10 E75 film was exposed to room light for several minutes, then developed in a monobath, as described in Example 2, for 2 minutes at 23° C. After drying, it did not appear reflective. It was concluded that the gelatin overcoat was reducing the overall reflectivity. The strip was immersed in a 0.5% Protease WT solution at 35° C. for 4 minutes. The reflectivity was in the range of 40% to 43% and the optical density in the red was 2.5 to 2.7. Protease WT is a mixture of enzymes and is a trademark of GB Fermentation Industries, Inc., of West Germany.

EXAMPLE 5

A commercially available Eastman Kodak SO 173 film was etched with a Protease WT 0.5% solution for 5 minutes at 35° C. in a darkroom to remove the gelatin overcoat. The film was then immersed in a hydrazine 68% aqueous solution for 2 seconds to create the developable surface latent image. It was then developed in a monobath as described in Example 2, for 5 minutes. After drying, it exhibited a reflectivity of 32% and a red density of 1.9 to 2.0.

EXAMPLE 6

An unexposed commercially available Agfa-Gevaert Millimask HD photoplate was dipped into a 68% aqueous solution of hydrazine for several seconds to create a developable surface latent image. It was then developed in monobath as described in Example 2 for 5 minutes at 23° C. and then dried. Samples exhibited reflectivities ranging between 39% and 41% at the emulsion surface and reflectivities of 17% to 18% when measured through the glass substrate. The gelatin under the reflective silver coating was so clear that the silver coating was visually reflective through the glass substrate. Optical densities in the red ranged between 0.8 and 1.0.

EXAMPLE 7

A commercially available photoplate manufactured by Konishiroku Photo Industries, of Japan, called a KR SN photoplate, has a 6-micron-thick emulsion which does not contain a screening dye but does contain an anti-halation backing coated on the back of the glass substrate. This photoplate was dipped into a 68% aqueous solution of hydrazine for a few seconds and then developed for 5 minutes at 23° C. in monobath as described in Example 2 and then dried. It exhibited a reflectivity from the emulsion side of 23% and an optical density in the red of 1.5.

EXAMPLE 8

A commercially available Agfa-Gevaert Millimask HD photoplate had latent images created on its surface by means of gaseous hydrazine. The photoplate was placed in a chamber which is exhausted of air down to 13 mm of mercury, after which hydrazine is evaporated into the chamber. The photoplate is exposed to this gas for 10 minutes in darkness and then developed in monobath, as described in Example 2, for 5 minutes at 23° C. After drying, the plate exhibited a reflectivity of 22% and an optical density in the red of 2.0.

EXAMPLE 9

A commercially available Agfa-Gevaert Millimask HD photoplate having a 4.5 micron thick emulsion and containing a screening dye was immersed in a water solution consisting of 5 grams/liter of potassium borohydride ($KBH_4$) for 2 seconds to fog the surface and create silver nuclei for silver diffusion transfer. After it was washed well, the photoplate was developed in the monobath described in Example 2 for five minutes at 23° C. When washed and dried, the plate exhibited a reflectivity of 75%.

EXAMPLE 10

A commercially available Agfa-Gevaert Millimask HD photoplate having a 4.5 micron thick emulsion and containing a screening dye was exposed to room light for several minutes and then developed for 2 hours in a monobath developer having the following constituents: p-methylaminophenol sulfate, 0.25 grams; ascorbic acid, 2.5 grams; sodium hydroxide, 2.0 grams; hydroxylamine hydrochloride ($HO-NH_2-HCL$), 5 grams; in a volume of one liter after adding water. After the photoplate was washed and dried, its reflectivity was measured at 18.5%.

EXAMPLE 11

A commercially available Agfa-Gevaert Millimask HD photoplate having a 4.5 micron thick emulsion and containing a screening dye was exposed to room light for several minutes and then immersed for five minutes at 23° C. in a monobath developer having the following constituents: catechol, 1 gram; sodium sulfite, 10 grams; sodium hydroxide, 2 grams; sodium thiocyanate, 25 grams; in a volume of one liter after adding water. After the photoplate was washed and dried, it exhibited a reflectivity of 56%.

EXAMPLE 12

A commercially available Agfa-Gevaert Milimask HD photoplate having a 4.5 micron thick emulsion and containing a screening dye was exposed through a photomask containing one micron serpentine lines for 8 seconds using an Ultratech contact printer and then immersed for five minutes at 23° C. in a monobath developer having the following constituents: catechol, $\frac{1}{2}$ gram; sodium sulfite, 10 grams; sodium hydroxide, 2 grams; sodium thiocyanate, 25 grams; in a volume of one liter after adding water. After the photoplate was washed and dried, its reflectivity was approximately 35%. This reflective serpentine pattern of one micron lines and one micron spaces was of excellent image quality and demonstrated the ability of this process to pre-record data and control indicia having image sizes of one micron.

EXAMPLE 13

A commercially available Agfa-Gevaert Millimask HD photoplate having a 4.5 micron thick emulsion and containing a screening dye was exposed to room light for several minutes and then immersed for five minutes at 23° C. in a monobath developer having the following constituents: catechol, $\frac{1}{2}$ gram; sodium sulfite, 10 grams; sodium hydroxide, 2 grams; 58% solution of ammonium hydroxide, 50 milliliters; in a volume of one liter after adding water. After the photoplate was washed and dried, its reflectivity was approximately 30%.

EXAMPLE 14

A commercially available Agfa-Gevaert Millimask HD photoplate having a 4.5 micron thick emulsion and containing a screening dye was exposed to room light for several minutes and then immersed for five minutes at 23° C. in a monobath developer having the following constituents: hydroquinone, $\frac{1}{2}$ gram; sodium sulfite, 10 grams; sodium hydroxide, 2 grams; 58% solution of ammonium hydroxide, 50 milliliters; in a volume of one liter after adding water. After the photoplate was washed and dried, its reflectivity was approximately 25%.

The appearance of the surface of the finished recording medium varies with the degree of reflectivity. At reflectivities of 50% or more it has a silver-like appearance. In the 35% to 45% range its color is like white gold, and in the 17% to 30% range it looks like yellow gold. Below about 12% reflectivity it has a reflective black appearance similar to black patent leather.

One of the principal differences between the single step diffusion transfer process of the present invention and the prior art is that in the present invention the unexposed and undeveloped silver halide is put into solution quickly so that the silver ion complex forming reaction takes place at a more rapid rate than silver diffusion transfer of the prior art since no chemical development is involved. In the prior art the development of the negative black image must be essentially completed before the remaining silver halide is complexed and transferred; otherwise, the positive image would in essence be fogged. Thus, in the prior art a very high concentration of developing agent is used to rapidly complete the chemical development process, while in the present invention a low concentration of chemical developer is used.

Nothing limits the silver diffusion transfer process of the present invention to use as a data storage medium.

The process may be used to make other articles where high reflectivity is needed in conjunction with various types of information imaging.

In the broadest sense, the invention comprises dispersing high electrical conductivity tiny metal spheres or spherical particles in a dielectric medium of low thermal conductivity and low melting temperature to form a laser recording medium. If these small particles are of very high volume concentration, e.g. between 20% to 70% of the volume of the reflective surface layer, the medium can exhibit very high reflectivities in the visible spectrum even though the reflective surface would have no measurable electrical conductivity. Such a dielectrically based electrically non-conducting reflective medium is desirable for laser recording.

What is claimed is:

1. A method of making a reflective laser recording medium from an unexposed photosensitive silver-halide emulsion layer incorporating a surface layer of high volume concentration silver precipitating nuclei having a size primarily less than five hundredths of a micron therein, the emulsion being disposed on a substrate with the nuclei layer disposed in said emulsion comprising, defining laser recording area in the silver-halide emulsion, contacting the unexposed and undeveloped photosensitive silver-halide emulsion layer incorporating the surface layer of silver precipitating nuclei with an aqueous monobath comprising a weak silver-halide developing agent and a rapid-acting silver-halide solvent for reacting with unexposed and undeveloped silver halide to form soluble silver ion complexes which are transported by diffusion transfer to the silver precipitating nuclei within said emulsion layer where the silver of said silver ion complexes is precipitated and adsorbed on said nuclei in the presence of said developer acting as a reducing agent, to the extent that a layer of aggregate and individual silver particles is formed exhibiting reflectivity of at least 15%.

* * * * *

UNITED STATES PATENT AND TRADEMARK OFFICE
CERTIFICATE OF CORRECTION

PATENT NO. : 4,298,684
DATED : November 3, 1981
INVENTOR(S) : Eric W. Bouldin and Jerome Drexler It is certified that error appears in the above—identified patent and that said Letters Patent is hereby corrected as shown below:

Col. 1, line 48   After the words "To date, tellurium" insert --has evolved as the most widely used of the metal films. However, tellurium--

Col. 2, line 13   The words "types of substrates" should read --types on substrates--

Col. 9, line 48   The words "need only effect" should read --need only affect--

Col. 12, lines 21 and 22   The words "used in photography in Polaroid-Land" should read --used in photography and in Polaroid-Land--

Col. 13, line 37 After the words "the unused" insert --silver--

Claim 1, col. 20, line 3   The words "defining laser recording area" should read --defining laser recording areas--

Signed and Sealed this

Seventeenth Day of August 1982

[SEAL]

Attest:

*Attesting Officer*

GERALD J. MOSSINGHOFF
*Commissioner of Patents and Trademarks*